United States Patent
Schwanka Trevisan

(10) Patent No.: US 12,142,923 B2
(45) Date of Patent: Nov. 12, 2024

(54) METHOD AND APPARATUS FOR DETECTING LOW-FREQUENCY OSCILLATIONS

(71) Applicant: Wobben Properties GmbH, Aurich (DE)

(72) Inventor: Aramis Schwanka Trevisan, Aurich (DE)

(73) Assignee: WOBBEN PROPERTIES GMBH, Aurich (DE)

( * ) Notice: Subject to any disclaimer, the term of this patent is extended or adjusted under 35 U.S.C. 154(b) by 686 days.

(21) Appl. No.: 17/258,128

(22) PCT Filed: Jul. 4, 2019

(86) PCT No.: PCT/EP2019/067974
§ 371 (c)(1),
(2) Date: Jan. 5, 2021

(87) PCT Pub. No.: WO2020/007970
PCT Pub. Date: Jan. 9, 2020

(65) Prior Publication Data
US 2021/0281071 A1 Sep. 9, 2021

(30) Foreign Application Priority Data
Jul. 6, 2018 (DE) .................. 10 2018 116 445.9

(51) Int. Cl.
*H02J 3/24* (2006.01)
*G05B 13/02* (2006.01)
(Continued)

(52) U.S. Cl.
CPC .............. *H02J 3/24* (2013.01); *G05B 13/024* (2013.01); *H02J 3/381* (2013.01); *H02J 3/48* (2013.01);
(Continued)

(58) Field of Classification Search
CPC .. G01R 19/2513; G01R 23/16; G01R 23/177; G05B 13/024; H02J 13/00002;
(Continued)

(56) References Cited

U.S. PATENT DOCUMENTS

| 2009/0116595 A1 | 5/2009 | Senroy et al. |
| 2011/0137474 A1* | 6/2011 | Larsen ...................... H02J 3/50 290/44 |

(Continued)

FOREIGN PATENT DOCUMENTS

| CN | 102305891 A | 1/2012 |
| CN | 103915859 A | 7/2014 |

(Continued)

OTHER PUBLICATIONS

D. McSwiggan, Analysis of Fixed-Speed Wind Farm Low-Frequency Power Pulsations using a Wavelet-Prony Method, Jul. 2010, IEEE (Year: 2010).*

(Continued)

*Primary Examiner* — Eric J Yoon
*Assistant Examiner* — Tameem D Siddiquee
(74) *Attorney, Agent, or Firm* — Seed IP Law Group LLP

(57) ABSTRACT

Provided is a method for detecting low-frequency oscillations, in particular subsynchronous resonance, in an electrical supply grid, wherein the electrical supply grid has a grid voltage at a grid nominal frequency, comprising the steps of capturing at least one electrical signal from the electrical supply grid, and evaluating the electrical signal by means of wavelet analysis, during which a time-dependent frequency pattern is created by analyzing a correlation of the captured signal with a predetermined wavelet mother function, wherein the presence of a low-frequency oscillation is assumed if at least one further low-frequency frequency (Continued)

component is present in the time-dependent frequency pattern in addition to a fundamental component.

16 Claims, 4 Drawing Sheets

(51) Int. Cl.
   *H02J 3/38* (2006.01)
   *H02J 3/48* (2006.01)
   *H02J 3/50* (2006.01)
   *H02J 13/00* (2006.01)

(52) U.S. Cl.
   CPC .......... *H02J 3/50* (2013.01); *H02J 13/00002* (2020.01); *H02J 2203/20* (2020.01); *H02J 2300/28* (2020.01)

(58) Field of Classification Search
   CPC ...... H02J 2203/20; H02J 2300/28; H02J 3/24; H02J 3/381; H02J 3/48; H02J 3/50; Y02E 60/00; Y04S 40/20
   See application file for complete search history.

(56) References Cited

U.S. PATENT DOCUMENTS

| | | | | |
|---|---|---|---|---|
| 2012/0098265 | A1* | 4/2012 | Skaare | B63B 39/062 290/53 |
| 2012/0232820 | A1* | 9/2012 | Wilson | H02J 3/241 324/76.77 |
| 2013/0010505 | A1* | 1/2013 | Bo | H02J 3/44 363/37 |
| 2013/0013231 | A1* | 1/2013 | Banerjee | B60L 3/0061 702/58 |
| 2013/0027994 | A1* | 1/2013 | Nelson | H02J 3/241 363/40 |
| 2016/0266208 | A1* | 9/2016 | Athikessavan | G01R 31/346 |
| 2017/0358997 | A1* | 12/2017 | Andersen | H02M 5/4585 |
| 2018/0138709 | A1* | 5/2018 | Hamann | F03D 7/0296 |
| 2019/0205778 | A1* | 7/2019 | Sahu | G06N 7/00 |
| 2019/0379205 | A1* | 12/2019 | Orfanoudakis | H02P 6/182 |

FOREIGN PATENT DOCUMENTS

| | | |
|---|---|---|
| CN | 105515018 A | 4/2016 |
| CN | 105606895 A | 5/2016 |
| CN | 107086566 A | 8/2017 |
| KR | 2002-0068215 A | 8/2002 |

OTHER PUBLICATIONS

Kelley, Using Time-Frequency and Wavelet Analysis to Assess Turbulence/Rotor Interactions, Nov. 1999, NREL, (Year: 1999).*

He et al., "Subsynchronous oscillation detection using phasor measurements and synchrosqueezing transform", IEEE 2015, 5 pages.

Liu et al., "Measurement-based method for wind farm power system oscillations monitoring", *IET Renewable Power Generation*, vol. 4, Issue 2, 2010, pp. 198-209.

Loutas et al., "Utilising the Wavelet Transform in Condition-Based Maintenance: A Review with Applications", Advances in Wavelet Theory and Their Applications in Engineering, Physics and Technology, Apr. 4, 2012, 42 pages.

McSwiggan et al., "Analysis of Fixed-Speed Wind Farm Low-Frequency Power Pulsations using a Wavelet-Prony Method", 2010 IEEE, Jul. 25, 2010, pp. 1-7.

Bruno et al., "'Taking the pulse' of Power Systems: Monitoring Oscillations by Wavelet Analysis and Wide Area Measurement System," *2006 IEEE PES Power Systems Conference and Exposition*, pp. 436-443, DOI: 10.1109/PSCE.2006.296352, Nov. 1, 2006. (8 pages).

Yu et al. "Recognition Method of Power System Oscillations and Short-circuit Based on Wavelet Analysis," *Journal of Shenyang Agricultural University* 42(5), Oct. 2011. (8 pages) (with English abstract).

Du, "Study on the methods of low frequency oscillation analysis in power system based on the simultaneous measurement," *Electronic Test* 294:88-89, 98, Apr. 15, 2014. (8 pages).

Zhang et al., "Low frequency oscillation identification method of power system considering its noise," *Journal of Huazhong University of Science and Technology (Natural Science Edition)* 45(4):90-96, Apr. 30, 2017. (13 pages).

* cited by examiner

METHOD AND APPARATUS FOR DETECTING LOW-FREQUENCY OSCILLATIONS

BACKGROUND

Technical Field

The present invention relates to a method for detecting low-frequency oscillations in an electrical supply grid. The present invention also relates to a detection device for detecting low-frequency oscillations in an electrical supply grid, and the invention relates to a wind power installation or to a wind farm having such a detection device.

Description of the Related Art

Wind power installations and wind farms having a plurality of wind power installations nowadays no longer or increasingly rarely supply the electrical supply grid during so-called grid parallel operation, but rather are also increasingly involved in grid support and grid stabilization. Such an electrical supply grid or a part of the latter can also be referred to as an energy system. In this case, such energy systems comprise electrical energy producers, electrical consumers and electrical lines, which directly or indirectly connect the electrical producers and consumers in order to transmit electrical power between the producers and consumers via said lines. Such energy systems are usually systems which are capable of oscillation and have natural modes below and above a system frequency, in particular a grid nominal frequency. Such a grid nominal frequency is usually a frequency of 50 Hz or 60 Hz. If such modes or oscillations are excited, such oscillations can impair the system stability if they are not adequately attenuated.

Wind power installations can contribute to the stabilization of such an energy system. In this case, it should be noted that the service life of a wind power installation, which can also be referred to as a wind turbine for simplicity, is usually designed for many years. Such a service life may usually be designed for 25 years, for example. In this respect, it should be noted that the energy system can change and develop greatly in this time.

If weakly attenuated grid oscillation modes are identified before connection to a wind farm, whether by means of direct information from the relevant grid operator or on the basis of simulation studies, these grid oscillation modes may possibly still be taken into account when designing wind turbine and wind farm controllers.

However, such an energy system can still develop, that is to say change, decisively during operation of a wind farm or a wind power installation. A controller of a wind power installation or of a wind farm initially designed for the energy system would then possibly no longer be sufficiently adapted to the energy system after it has changed.

In order to combat this problem, it would be desirable, for example, to observe the system characteristic of such an energy system. However, such observation may be complicated and costly. In addition, the question arises of how such observation of the system characteristic is intended to be evaluated.

In addition to the problem of being able to further process such observation in the system, the problem may also arise of special characteristics, such as low-frequency oscillations, occurring only briefly. This may result, in particular, in such a low-frequency oscillation being difficult to capture. In particular, it is already difficult to capture a frequency which occurs only occasionally. However, even if such a frequency can be captured, the difficulty in detecting that it is a low-frequency oscillation also arises. This is because, if a low-frequency oscillation occurs only for a short period, it can also be considered to be a transient result or a transient process. In addition to the physical detection, the interpretation of such a fleeting oscillation is therefore also problematic.

BRIEF SUMMARY

Described herein is detecting a low-frequency oscillation in an electrical supply grid, in particular even when the oscillation does not occur on an ongoing basis.

A method is proposed. Such a method is a method for detecting low-frequency oscillations, in particular subsynchronous resonance, in an electrical supply grid. Subsynchronous resonance, that is to say resonance at a frequency below the grid nominal frequency, therefore forms low-frequency oscillations. In this respect, subsynchronous resonance is a possibility of low-frequency oscillations, but low-frequency oscillations may also occur, for example, without being based on resonance or without resonance being the cause.

In this consideration, an electrical supply grid having a grid voltage at a grid nominal frequency is therefore assumed. The low-frequency oscillation to be detected has a frequency which is preferably lower than the grid nominal frequency.

In particular, the low-frequency oscillations may have values of 1 Hz and less. However, they may also extend to five times the value of the grid nominal frequency. Oscillations having a frequency of at most five times the value of the grid nominal frequency, preferably having a frequency which corresponds at most to the grid nominal frequency, are referred to here as low-frequency oscillations. In particular, the low-frequency oscillation does not have a frequency which corresponds to a multiple of the grid nominal frequency. It should be noted that the examination and consideration of low-frequency oscillations are used, in particular, to examine or ensure system stability of the electrical supply grid. This is distinguished from an assessment of the grid quality or signal quality of the voltage signal in the electrical supply grid, during which harmonics are important, in particular.

The method now first of all comprises the step of capturing at least one electrical signal from the electrical supply grid. A voltage measurement at the grid connection point, for example, at which a wind power installation or a wind farm supplies the electrical supply grid, is proposed here, in particular. A three-phase measurement is preferably carried out here if the electrical supply grid is a three-phase electrical supply grid, which can usually be assumed.

The electrical signal is then evaluated by means of wavelet analysis. Wavelet analysis is fundamentally known and, in this respect, reference is made to appropriate technical literature and to the expert knowledge of a person skilled in the art. However, it is now proposed here to use this wavelet analysis to evaluate the electrical signal in order to detect low-frequency oscillations.

A time-dependent frequency pattern is created during the proposed wavelet analysis. This is carried out by analyzing a correlation of the captured signal with a predetermined wavelet mother function. This wavelet mother function is therefore predetermined, that is to say can be predefined. It may be permanently predefined and stored, for example, or changes in the wavelet mother function also come into consideration. The practice of respectively carrying out a plurality of analyses also comes into consideration, wherein the analyses each use different wavelet mother functions.

In any case, a time-dependent frequency pattern results when analyzing the correlation of the captured signal with the predetermined wavelet mother function. Frequencies are therefore plotted against the time in the time-dependent frequency pattern. For visualization, for example, it is possible to use a graph which uses the abscissa as the time axis and plots frequency values as the ordinate. However, the values are not plotted as individual values, but rather in the sense of a density of their occurrence, by being able to assign a percentage energy using a color code, for example.

This is a graphical type of representation, in particular, but the information on which such a graphical representation is based can also be evaluated further in a process computer as values or a set of values, even without being visualized.

It is now proposed that the presence of a low-frequency oscillation is assumed if at least one further low-frequency frequency component is present in the time-dependent frequency pattern in addition to a fundamental component. In this respect, it should be repeated that, although the time-dependent frequency pattern can be graphically represented, it need not be graphically represented for further evaluation. A time-dependent frequency pattern here means, in particular, that different frequencies of different intensity, that is to say of different amplitude, may also result at different times. Therefore, an individual number and an individual time-dependent scalar function do not result, but rather time-dependent information, specifically many items of frequency information at any time. This is referred to here as a time-dependent frequency pattern.

The fundamental component is here usually the grid nominal frequency, but the actual grid frequency may deviate from the grid nominal frequency, in which case only a slight deviation can probably be expected, which can also be accordingly reflected in the time-dependent frequency pattern if the accuracy for the deviation from the grid nominal frequency is sufficient. This fundamental component is not important, however, apart from the fact that it can be easily identified and should not be interpreted as a detected low-frequency oscillation. This fundamental component can therefore be ignored or can be removed during further evaluation and only that which remains in addition to this fundamental component is examined in order to detect the low-frequency oscillations.

If, therefore, a frequency in the range from 4 to 6 Hz occurs frequently and with a sufficient intensity in this time-dependent frequency pattern, for example, a low-frequency oscillation in the range from 4 to 6 Hz can be considered to be detected. For example, a threshold value can be taken as a basis for the intensity. Additionally or alternatively, a temporal minimum component which is distributed over time can be taken as a basis for assuming a detected low-frequency oscillation. If, for example in a considered period, a low-frequency oscillation has therefore occurred only in a range of 10% of the entire period, this cannot be considered to be sufficient for detecting a low-frequency oscillation, for example. In contrast, if it occurs to a greater extent, for example more than 50% in the time range, this could be considered to be detection of a low-frequency oscillation, but possibly only when the intensity is sufficiently high. This is intended to apply only for illustration and different criteria, for example different thresholds, may be taken as a basis, in principle.

According to one embodiment, it is proposed that a check is additionally carried out in order to determine whether the at least one further low-frequency frequency component fluctuates aperiodically. In particular, it has been recognized that the proposed evaluation of the electrical signal by means of the wavelet analysis results in the time-dependent frequency pattern and this time-dependent frequency pattern directly makes it possible not only to capture the occurrence of further low frequencies but also to consider their distribution over time. In particular, an aperiodic fluctuation in this respect is a change in this at least one further low-frequency frequency component over time. This frequency component is therefore not permanently present, but rather changes, in which case the change is not periodic. Low-frequency frequency components which are not permanently present can therefore also be captured, in particular.

However, periodically fluctuating frequency components, that is to say frequency components which do not occur permanently but periodically do not occur permanently or occur in a weaker form, can also be captured thereby and can be relevant to the assessment of the grid condition.

According to a further configuration, it is proposed that a temporal profile of an amplitude of the at least one further frequency component is captured. This information can also be advantageously gathered from the time-dependent frequency pattern. In particular, the change in the frequency component can be detected by capturing this profile of the amplitude of the further frequency component. In particular, it is possible to detect whether the amplitude increases or decreases. A critical situation which should trigger intervention, if appropriate, can be inferred, in particular, when the amplitude increases, that is to say increases with time. Depending on a temporally increasing amplitude of a further frequency component, attenuating measures should then be carried out; in particular, an attenuating electrical signal should be supplied to the electrical supply grid.

However, it also comes into consideration that the amplitude changes without exhibiting a clear tendency to decrease or increase. Conclusions with respect to the situation in the electrical supply grid can possibly be drawn from the type of change in the amplitude.

According to one embodiment, it is proposed that a test frequency range is taken as a basis for evaluating the electrical signal. This test frequency range therefore specifies the frequency range in which the low-frequency oscillations are searched for.

It is proposed that the test range extends from a frequency lower limit to a frequency upper limit. It is therefore defined by this frequency lower limit and the frequency upper limit. In this case, the frequency lower limit is in a range from 0.1 Hz to 2 Hz, and it is proposed, in particular, to select the value of 1 Hz as the frequency lower limit.

The frequency upper limit is in a range from a value of the nominal frequency to a value of five times the nominal frequency. In particular, the value of the nominal frequency is selected as the frequency upper limit. In particular, the test frequency range therefore extends from 1 Hz to the nominal frequency, that is to say extends from 1 Hz to 50 Hz or from 1 Hz to 60 Hz for conventional electrical supply grids.

The test frequency range can be defined, in particular, by selecting an appropriate period for which the electrical signal is recorded for evaluation. The electrical signal can naturally also be recorded for a longer time and a corresponding time section of the signal can then be used as the electrical signal to be evaluated or as the electrical signal section to be evaluated. It also comes into consideration that such a period of the signal to be evaluated is constantly shifted, like a window, across a permanently recorded electrical signal and a new evaluation can thus be continuously carried out for the same length of period.

The test frequency range is then naturally also concomitantly determined by the sampling frequency. In particular, sampling should be carried out at at least twice the frequency of the frequency upper limit. In order to be able to capture the frequency range of the frequency lower limit, at least one period of the electrical signal corresponding to the reciprocal of the frequency lower limit must be evaluated. If the frequency lower limit is therefore intended to be 0.1 Hz, the signal must be evaluated at least over a period of 10 s.

Furthermore, it is also proposed that the wavelet mother function to be selected is adapted, in particular in terms of its temporal extent, to the test frequency range, since it influences which frequency range responds to the wavelet mother function during the correlation analysis.

It is preferably proposed that the wavelet mother function is selected according to the expected oscillation mode. This makes it possible to achieve particularly fast capture since there is no need to search for an arbitrary oscillation.

The method is preferably characterized in that a three-phase voltage, in particular the grid voltage, is captured as the electrical signal, and the three-phase voltage captured in this manner is filtered or transformed, and the wavelet analysis is applied to the filtered or transformed signal. In particular, the described correlation with the predetermined wavelet mother function is carried out with this transformed or filtered signal. A transformation of the captured three-phase signal, that is to say the captured three-phase voltage, may mean, in particular, that a transformation into a d/q representation is carried out. In such a known d/q representation, the three-phase signal can be represented by a d component and a q component. During its use for analysis, that is to say for the correlation in particular, the wavelet mother function is preferably adapted to the representation of the three-phase signal in the d/q representation.

The transformation into said d/q representation therefore also makes it possible to achieve the situation in which the three voltage signals of the three-phase signal can be considered together.

However, filtering also comes into consideration, which filtering is in the form of a bandpass filter or a low-pass filter for example, in order to filter out frequency ranges which do not need to be considered, with the result that they do not need to be considered in the wavelet analysis. This is also a possible way of defining a test frequency range. In this case, it is often sufficient to exclude or at least significantly reduce high frequencies which do not need to be examined by means of the filtering. Very low frequencies, that is to say below the desired test frequency range, are usually not present in such a signal or have already been excluded by virtue of the measurement period being accordingly short.

In order to capture a power oscillation in particular, transformation is proposed, namely carrying out a d/q transformation for corresponding currents and voltages and then calculating the powers from the transformed currents and voltages. This makes it possible to determine particularly well a function of a power or a power profile, to which a wavelet mother function can be applied.

According to one embodiment, it is proposed that the wavelet mother function has at least one property from the following list:

1. The wavelet mother function is prepared to be scalable.

The wavelet mother function can be described, in particular, as a time signal, that is to say as a function which varies over time, for example:

$$f(t) = \cos(k \cdot t) \cdot \frac{1}{(k \cdot t)^2 + 1}$$

In this formula, the function f(t) is intended to form the wavelet mother function and this function would be scalable, in particular also scalable in terms of time. This can be achieved by accordingly selecting the factor k in this exemplary wavelet mother function. For example, this wavelet mother function with the factor k=1 can be referred to as a basic function or as an un-scaled function and the scaling can be carried out by changing the factor k. If k=2 is selected as the factor, for example, compression of this wavelet mother function would result.

However, even considering the same wavelet mother function in the frequency domain results in the function being able to be scaled in terms of frequency, that is to say being able to be compressed or stretched according to the frequency, by changing the factor k.

The wavelet mother function is therefore prepared to be scalable. The factor k shown in the example is provided for this purpose and is used to achieve the scaling. This scalability in terms of time or frequency makes it possible to capture different frequencies. In particular, the test frequency range can be selected thereby or, inter alia, thereby.

2. The wavelet mother function is prepared to be shiftable in terms of time.

This can mean, for example, that, in the illustrative exemplary wavelet mother function shown above, a time with an offset is used instead of the time t. In the formula, "t" can therefore be replaced with "t+$t_0$", for example. This then results in a shift by the time to, in which case this time to may also be negative. Such a shift of the wavelet mother function possibly makes it possible to better obtain information relating to when the respective frequency, that is to say the low-frequency oscillation to be detected, occurs. Wavelet analysis is preferably carried out repeatedly with the same wavelet mother function, in which case, however, a temporally shifted wavelet mother function is respectively used as the only difference. As a result, a plurality of time-dependent frequency patterns can then be created, and dominant low-frequency oscillations, that is to say dominant low frequencies, can then possibly occur therein at different locations but also with a different form, depending on how the wavelet mother function used was related in terms of time to the analyzed signal. Somewhat clearly expressed, this low-frequency oscillation or this low frequency may occur to different extents in the time-dependent frequency pattern depending on the extent to which it has occurred in the center of the wavelet mother function.

3. The wavelet function has locality both in the frequency domain and in the time domain. In this case, locality should be understood as meaning that the wavelet mother function is not evenly distributed, that is to say is not evenly distributed either in the time domain or in the frequency domain. For example, a sine function is evenly distributed in the time domain and therefore does not have any locality in the time domain since it oscillates uniformly with the same amplitude over the entire range considered. A Dirac pulse has a (strong) locality in the time domain but—at least theoretically—does not have any locality in the frequency domain since it corresponds to white noise in the frequency domain.

However, it is proposed here that locality is present both in the frequency domain and in the time domain. This property is satisfied by the above-mentioned exemplary function, for example. It specifically has the greatest value for t=0, which is not reached at any other location. It therefore has its locality in the region of t=0. It also exists outside this region, but decays with increasing time or in the negative direction with an increasing interval of time.

This exemplary wavelet mother function also has locality in the frequency domain because it specifically has its main form at the frequency of the cos function used there. As a precaution, it is pointed out that the above-mentioned illustrative exemplary wavelet mother function naturally is not stated precisely, since the cos function depends on the time there, that is to say would also have to be normalized to a time or fundamental frequency during the actual implementation. If it were normalized to or based on 1 Hz as the fundamental frequency, for example, its greatest value would accordingly be at 1 Hz in the frequency domain.

This locality also achieves the situation, in particular, in which the temporal inhomogeneity of the captured electrical signal is captured during the wavelet analysis of said signal. In other words, it is thereby possible to capture particularly well when a low-frequency oscillation or the accordingly low frequency occurs.

4. The wavelet mother function preferably has an integral of zero. If an integral is therefore formed over the entire wavelet mother function used, the result is zero. As a result, despite locality of the wavelet mother function, the situation is achieved, in particular, in which this function is balanced in the time domain in the positive and negative ranges, that is to say clearly expressed above and below the time axis. This may also be advantageous, in particular, during use in the frequency domain or during the transformation from the time domain to the frequency domain because a DC component is virtually avoided.

5. A Morlet wavelet, a Daubechies D20 wavelet or a Mexican hat is used as the wavelet mother function. These wavelet functions are fundamentally known to a person skilled in the art, but it has been recognized here that they are particularly useful for detecting the low-frequency oscillations. The Mexican hat can moreover be defined by the above-mentioned illustrative exemplary mother wavelet function.

According to one embodiment, it is proposed that a wavelet mother function is selected on the basis of a selection criterion from a plurality of predetermined wavelet functions. Additionally or alternatively, the wavelet mother function is parameterized on the basis of a selection criterion. Such a selection criterion may itself comprise a plurality of individual criteria or a plurality of values which are taken into account for the selection from the wavelet functions or for the parameterization. The practice of taking the test frequency range into account comes into consideration, for example, as a selection criterion. The wavelet function can therefore be selected on the basis of the test frequency range. For example, it is possible to select a wavelet function which is defined via a time range which, on account of its length, matches the test frequency range, to name just one example. Likewise or additionally, the wavelet function can also be parameterized in this sense. An appropriate stretching parameter can be selected, in particular in the case of a stretchable wavelet function, in such a manner that the wavelet function matches the test frequency range, to name a further clear example.

However, it is preferably proposed that the selection criterion has at least one expected value of the electrical signal. This means, in particular, that a low-frequency oscillation is already expected here because it has already occurred once earlier, for example. In this respect, the selection and/or parameterization can also be carried out here on the basis of an expected value of the electrical signal.

The expected value of the electrical signal can therefore relate, for example, to a specific frequency value or a frequency range, for which or in which a low-frequency oscillation has already occurred. Times at which such a low-frequency oscillation occurs are possibly also known and this can then also be taken into account when selecting and/or parameterizing the wavelet function for the wavelet mother function. It also comes into consideration that a plurality of low-frequency oscillations can be expected, to name a further example, and the wavelet mother function can also be accordingly adapted thereto.

In particular, it is proposed that one of a plurality of predetermined wavelet functions is first of all structurally selected on the basis of the expected value or generally the expected electrical signal. For example, different wavelet functions come into consideration depending on whether one or more low-frequency oscillations can be expected.

After making such a selection on the basis of a structural consideration, parameterization of the wavelet function can then be carried out or changed. A stretching or compression also comes into consideration here, in particular. The criterion for this may be, in particular, an expected frequency range or a specific expected frequency.

Accordingly, a wavelet mother function can therefore be determined on the basis of a selection criterion, wherein the selection criterion considers a plurality of items of individual information. In the example mentioned, these were the two items of information relating to whether one or more low-frequency oscillations are expected and which frequency range is relevant. The wavelet function was initially selected and then parameterized on the basis thereof.

According to one embodiment, it is proposed that the method is carried out at a grid connection point, at which at least one decentralized production unit supplies the electrical supply grid. Such a decentralized production unit may be, in particular, a wind power installation or a wind farm comprising a plurality of wind power installations. In this respect, it is proposed that, in order to detect the low-frequency oscillations, at least one electrical variable of the supply is recorded and is evaluated by means of any or said wavelet analysis. The evaluation or analysis may naturally also be indirectly applied to this at least one recorded electrical variable if the electrical variable of the supply has first of all been transformed for this purpose, for example.

By virtue of the use of such an electrical variable of the supply, the decentralized production unit is therefore used to detect the low-frequency oscillation. This has the advantage, in particular, that this decentralized production unit is present anyway and usually also has adequate measuring sensors which can then be additionally used to record the at least one electrical variable of the supply. It also comes into consideration that at least one electrical variable of the supply of this type is present as a variable anyway in the decentralized production unit, in particular in a corresponding control unit, and this variable which is present anyway can then be evaluated by means of the wavelet analysis.

It should be noted that this at least one electrical variable of the supply may also be the already mentioned electrical signal from the electrical supply grid. In particular, a voltage at the grid connection point or a corresponding voltage at an output of the decentralized production unit would be a voltage, for which the decentralized production unit supplies electrical current to the electrical supply grid.

The use of this decentralized production unit may also have the advantage that, if a low-frequency oscillation is detected, the type and amplitude of which are such that attenuation is advisable, the decentralized production unit can also carry out such attenuation. For this purpose, the decentralized production unit preferably adapts its supply, in particular the supply of an electrical current, in such a manner that the detected low-frequency oscillation is attenuated. In particular, the decentralized production unit changes an active power component of the supplied active power in such a manner that the detected low-frequency oscillation is attenuated.

The at least one electrical variable which is recorded may be the supplied current, the supplied reactive power, the supplied active power, or the already mentioned voltage at the grid connection point or a voltage proportional thereto, for which the decentralized production unit supplies electrical current to the electrical supply grid. In principle, a plurality of these variables may also be recorded and may be subjected separately to wavelet analysis, for example. This may have the advantage that some oscillations occur to a greater extent or can be detected better in one of the electrical variables mentioned.

The voltage at the grid connection point is preferably evaluated because low-frequency oscillations, in particular, can occur in the voltage.

The use of the supplied current may be advantageous, in particular, when the voltage or at least a voltage measurement is disrupted by high-frequency signals or such high-frequency signals are superimposed. Such high-frequency signals sometimes cannot occur or occur to a lesser extent in the supplied current which may nevertheless have the low-frequency oscillation.

The use of the supplied reactive power may also reflect such a low-frequency oscillation of the grid voltage, that is to say also of the voltage at the grid connection point. In this case, the supplied reactive power is not affected or at least is less affected by power fluctuations which, in wind power installations, may be caused, in particular, by fluctuations in the wind. It also comes into consideration that the decentralized production unit operates in a so-called STATCOM mode in which no active power is supplied. Such a mode may also be present, in particular, if, owing to a lack of wind, if the decentralized production unit is a wind power installation, no active power can be supplied. In this case, reactive power can still be supplied, however, and this can provide information relating to a low-frequency oscillation.

The use of the supplied active power can be advantageous, in particular, when the low-frequency oscillations are associated with or are triggered by subsynchronous resonance, in the case of which energy or power oscillates back and forth in the electrical supply grid.

One configuration proposes a method which is characterized in that the detected low-frequency oscillation is considered to be a grid oscillation, a wind power installation is provided, which wind power installation has a rotor with rotor blades, a generator and an inverter for supplying electrical power to the electrical supply grid, and wherein it is additionally captured whether the wind power installation is involved in the grid oscillation. In this respect, it is also proposed that a low-frequency oscillation of the wind power installation is captured as an installation oscillation by means of wavelet analysis, in particular from an DC link voltage in a DC link of the inverter, and a check is carried out in order to determine whether the grid oscillation and the installation oscillation correlate. It is assumed that the wind power installation is involved in the grid oscillation if the grid oscillation and the installation oscillation correlate.

It has been recognized that grid oscillations may have very different relevance to a wind power installation or a wind farm and can be divided into two categories with respect to this relevance. Accordingly, it is proposed to distinguish whether or not a wind power installation is involved in a low-frequency oscillation in the electrical supply grid, that is to say in a grid oscillation. If the wind power installation is involved in the grid oscillation, this means that the wind power installation itself has this oscillation and also contributes, in particular, to such a grid oscillation. There is therefore interaction between the grid oscillation and an oscillation of the wind power installation.

A modern wind power installation which is taken as a basis here has a rotor with rotor blades, a generator and an inverter for supplying electrical power to the electrical supply grid. It has been recognized that these elements, in particular, can oscillate and/or can influence the oscillation.

In order to distinguish these categories, it should first of all be detected which category is currently present. For this purpose, in addition to a detected grid oscillation, a check is carried out for a low-frequency oscillation in the wind power installation, which is therefore referred to as an installation oscillation. The use of wavelet analysis is also proposed for this purpose. In this respect, a signal from the wind power installation is examined and the DC link voltage of the inverter can preferably be used for this purpose. It has been recognized that this DC link voltage is highly suitable for detecting an installation oscillation. This is also due to the fact, in particular, that both oscillations of the supply and of the generator and possibly also mechanical oscillations are reflected in fluctuations of the voltage of the DC link. The DC link voltage can also be measured effectively.

Both the grid oscillation and the installation oscillation have therefore been captured by means of wavelet analysis and can be compared. The use of the wavelet analysis also makes it possible to capture changes in each of the oscillations over time. This can also be compared for both oscillations.

It has now been recognized that the wind power installation is involved in the grid oscillation if these two oscillations correlate. This is the case, in particular, if their frequencies correlate. However, a correlation between the temporal occurrence of both oscillations can also be considered. The wavelet analysis makes it possible to detect when the respective oscillations have occurred and the temporal correlation of both oscillations can then be checked on the basis thereof.

Depending on whether the wind power installation is involved in the oscillation, adapted measures can be taken. If the wind power installation is involved in the grid oscillation, its own oscillation or its own oscillation component should be attenuated, in particular. If it is not involved, it can nevertheless make a contribution to attenuation which is focused on supplied variables, in particular, and takes into account dynamic responses of the electrical supply grid.

It is preferably proposed that, if it has been detected that the wind power installation is involved in the grid oscillation, the installation oscillation is checked in order to determine whether it exceeds a predefined oscillation amplitude. In comparison with the check for correlation between the grid oscillation and the installation oscillation, there is therefore also a check for an oscillation amplitude. Attenuation measures are then initiated if the installation oscillation exceeds the predefined oscillation amplitude.

The following come into consideration as attenuation measures, in which case a plurality of these measures can also be combined.

One attenuation measure is to increase an attenuation component of a control system of the generator, in particular a stator current of the generator. The generator can be controlled using the stator current or a power output from the generator. The generator torque, for example, can be adjusted thereby. The generator torque may be adjusted on the basis of a speed of the aerodynamic rotor and therefore on the basis of the speed of the generator, wherein the generator torque then influences the speed again. The system can therefore oscillate and this can be intensified or attenuated by means of appropriate control. This control can be effected using an active rectifier which rectifies the stator current.

If the stator current is controlled, this also influences the DC link, into which the stator current passes from the generator via a rectifier. As a result, the DC link voltage can also be controlled, and an attenuating property may be in the foreground as a result of appropriate controller parameterization.

A further attenuation measure is to use pitch control to adjust a blade angle of the rotor blades, wherein an attenuation component is increased or adjusted. Pitch control can be provided, in particular, in the event of power changes, which pitch control can control the energy taken from the wind by the rotor by adjusting the blade angle of the rotor blades. If the power of the wind power installation fluctuates without this reflecting fluctuations in the wind, this fluctuation can be counteracted by means of pitch control. In this case, a dynamic response of the rotor and also of the rotor blades and of their adjustment drives for adjusting the blade angles should also be heeded, in particular. This should be heeded during pitch control and the control can be set to be slower for the purpose of attenuation.

A further attenuation measure is to increase an attenuation component of a supply control system for controlling the inverter for supplying the electrical supply grid. Control of the supply is accordingly provided and controls, in particular, a power to be supplied, in particular a current to be supplied. In this case, the priority may be to keep the supply as constant as possible. Oscillations may also occur here and may be attenuated by means of appropriate parameterization by increasing a time constant, for example, or by shifting an eigenvalue pair into a range with fewer oscillations in the design of the controller.

A further attenuation measure is to shift an operating point of the supply, in particular by reducing the supplied power. Here, a steady power reduction may already result in oscillation attenuation or reduction if the load on the electrical supply grid is relieved thereby. This can also be associated with an increase in the reactive power which becomes possible as a result and reduces oscillations. The shift of the operating point can generally result in the operating point being further away from stability limits and thereby having an oscillation-reducing effect.

Limit cycles which can be produced by reaching limits are also avoided. As a result of the operating point being shifted, the latter may be further away from such limits, which avoids the occurrence of limit cycles.

A further attenuation measure is to activate current control of the inverter in order to control a supply current, wherein an attenuation component is increased or adjusted. The use of current control of the supplied current can also be used to adjust or attenuate at least one oscillation of the supplied current and this can be achieved using an accordingly adjusted attenuation component.

A further embodiment proposes a method which is characterized in that the at least one electrical signal is captured by means of a measurement which samples at a sampling frequency in order to respectively obtain a sampling signal of the electrical signal. In this respect, it is proposed that the sampling frequency is a multiple above the fundamental component, in particular has a value which is at least ten times the fundamental component, in order to capture a transient character of the electrical signal, wherein, in order to evaluate the electrical signal, the sampling signal is respectively evaluated by means of the wavelet analysis, in particular without filtering which changes the transient character of the electrical signal.

The signal to be evaluated is therefore sampled directly and is included in the wavelet analysis. As a result, a temporal profile of the signal to be evaluated can be effectively recorded and evaluated. In comparison with use of the Prony method for example, this has the advantage that all information is still present in the signal when it is included in the wavelet analysis for evaluation.

Provided is a detection device for detecting low-frequency oscillations, in particular subsynchronous resonance, in an electrical supply grid. This detection device is based on an electrical supply grid which has a grid voltage at a grid nominal frequency. The fact that the low-frequency oscillations to be detected have a lower frequency than the grid nominal frequency is also taken as a basis. This detection device comprises a capture device for capturing at least one electrical signal from the electrical supply grid. In particular, this capture device may be in the form of a measurement means or measurement sensor. The measurement sensor or the measurement device may be, in particular, a voltage measurement device (voltmeter) for capturing a voltage at a grid connection point.

There is also an evaluation device which is configured to evaluate the electrical signal. In this case, it is configured in such a manner that the evaluation is carried out by means of wavelet analysis, during which a time-dependent frequency pattern is created by analyzing a correlation of the captured signal with a predetermined wavelet mother function. In particular, the evaluation device has, for this purpose, a microprocessor or a process computer in which corresponding wavelet analysis, in particular the correlation analysis mentioned, is implemented. This also involves creating the time-dependent frequency pattern. Such a time-dependent frequency pattern can also be preferably graphically output. In particular, however, the evaluation device creates such a time-dependent frequency pattern as a corresponding data record which can be processed further for further evaluation.

For this purpose, the evaluation device is specifically also configured to detect the presence of a low-frequency oscillation if at least one further low-frequency frequency component is present in the time-dependent frequency pattern in addition to a fundamental component. In particular, this analysis which checks for this additional further low-frequency frequency component is also implemented in the evaluation device, in particular the microprocessor or process computer. The implementation may be provided in such a manner that it is provided in a further function block, to which the time-dependent frequency pattern is transferred.

This has the advantage, in particular, that, in addition to this computer-aided further evaluation, the time-dependent frequency pattern can also be graphically output, in particular on a monitor or printer, in particular a color printer. An output interface is preferably also provided in order to transmit the created time-dependent frequency pattern to a central unit (operator). A central unit can then, possibly additionally, automatically or manually evaluate or check this time-dependent frequency pattern.

According to one embodiment, it is proposed that the detection device is arranged at a grid connection point, at which at least one decentralized production unit, in particular a wind power installation or a wind farm, supplies the electrical supply grid. In this case, the capture device is prepared to record at least one electrical variable of the supply. The evaluation device is then prepared to evaluate this at least one recorded electrical variable by means of any or the wavelet analysis. In this case, the at least one electrical variable is a current supplied by the decentralized production unit, a power supplied by the decentralized production unit, specifically a reactive power and/or an active power, or a voltage at the grid connection point or a voltage proportional thereto, for which the decentralized production unit supplies electrical current to the electrical supply grid. Such a detection device can therefore be advantageously arranged and used in such a decentralized production unit. It may also be part of the decentralized production unit, in particular part of a control unit (controller) of the decentralized production unit, for example part of a farm controller or part of a wind power installation controller.

Otherwise, the advantages and effects of this detection device at a grid connection point, at which the decentralized production unit is arranged, emerge from the above explanations of corresponding embodiments of a method for detecting low-frequency oscillations, which method is carried out at a grid connection point, at which at least one decentralized production unit provides a supply.

A detection device is preferably characterized in that it uses or implements a method according to at least one embodiment described above.

Provided is a decentralized production unit, in particular a wind power installation or a wind farm. Such a decentralized production unit, for the purpose of supplying electrical power to an electrical supply grid, is connected to this electrical supply grid at a grid connection point. In this case, the decentralized production unit comprises a detection device for detecting low-frequency oscillations, in particular subsynchronous resonance, in the electrical supply grid. In this case, the electrical supply grid has a grid voltage at a grid nominal frequency, and the low-frequency oscillations to be detected have a lower frequency than the grid nominal frequency. In this case, the detection device comprises a capture device for capturing at least one electrical signal from the electrical supply grid. The detection device also comprises an evaluation device for evaluating the at least one captured electrical signal. The evaluation device in this case uses wavelet analysis, during which a time-dependent frequency pattern is created by analyzing a correlation of the captured signal with a predetermined wavelet mother function. In this case, the evaluation device is configured such that it detects the presence of a low-frequency oscillation if at least one further low-frequency frequency component is present in the time-dependent frequency pattern in addition to a fundamental component. In this case, the detection device is preferably designed and/or operates, in particular, in the manner explained above according to one embodiment of a detection device.

BRIEF DESCRIPTION OF THE SEVERAL VIEWS OF THE DRAWINGS

The invention is explained in more detail, by way of example, below on the basis of embodiments and with reference to the accompanying figures.

DETAILED DESCRIPTION

Figure 1:
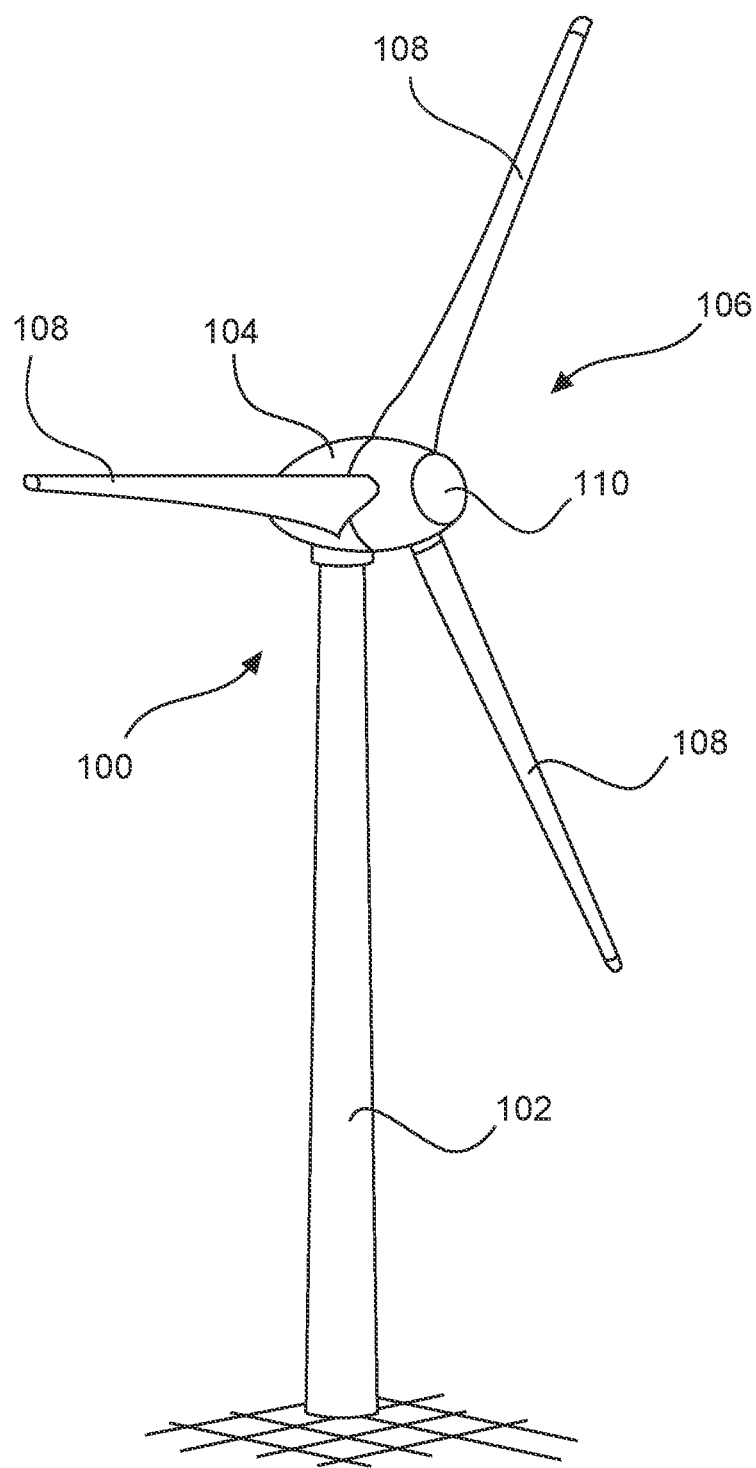
FIG. 1 shows a perspective illustration of a wind power installation.

FIG. 1 shows a wind power installation 100 having a tower 102 and a nacelle 104. A rotor 106 having three rotor blades 108 and a spinner 110 is arranged on the nacelle 104. The rotor 106 is caused to rotate during operation by the wind and thereby drives a generator in the nacelle 104.

Figure 2:
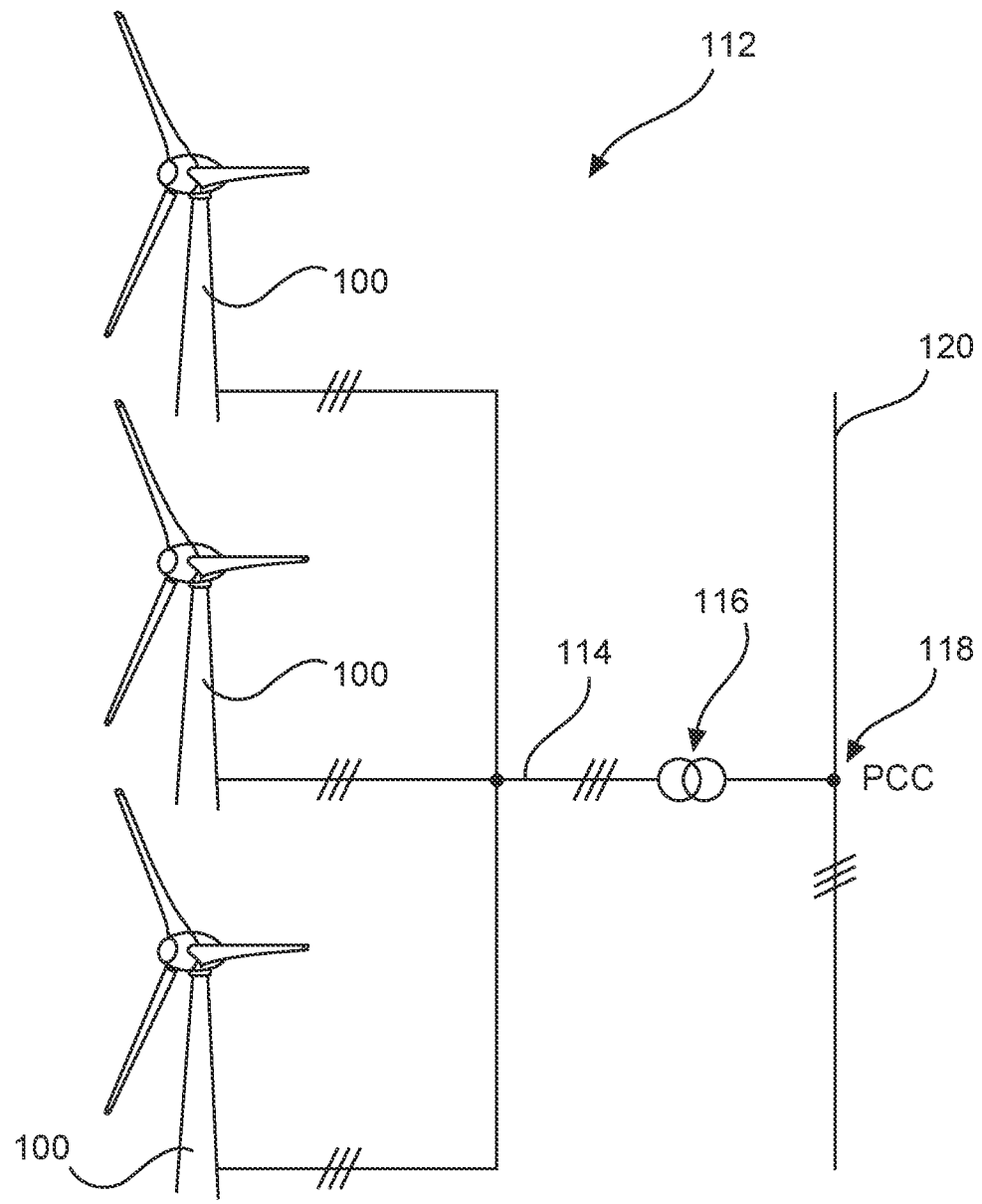
FIG. 2 shows a schematic illustration of a wind farm.

FIG. 2 shows a wind farm 112 having, by way of example, three wind power installations 100 which may be identical or different. The three wind power installations 100 are therefore representative of fundamentally any desired number of wind power installations in a wind farm 112. The wind power installations 100 provide their power, specifically in particular the produced current, via an electrical farm grid 114. In this case, the respectively produced currents or powers from the individual wind power installations 100 are added and a transformer 116 is usually provided, which transformer steps up the voltage in the farm in order to then supply it to the supply grid 120 at the supply point 118 which is also generally referred to as a PCC. FIG. 2 is only a simplified illustration of a wind farm 112, which does not show a controller, for example, even though a controller is naturally present. The farm grid 114 may also have a different design, for example, by virtue of a transformer also being present at the output of each wind power installation 100, for example, to name just one other exemplary embodiment.

Figure 3:
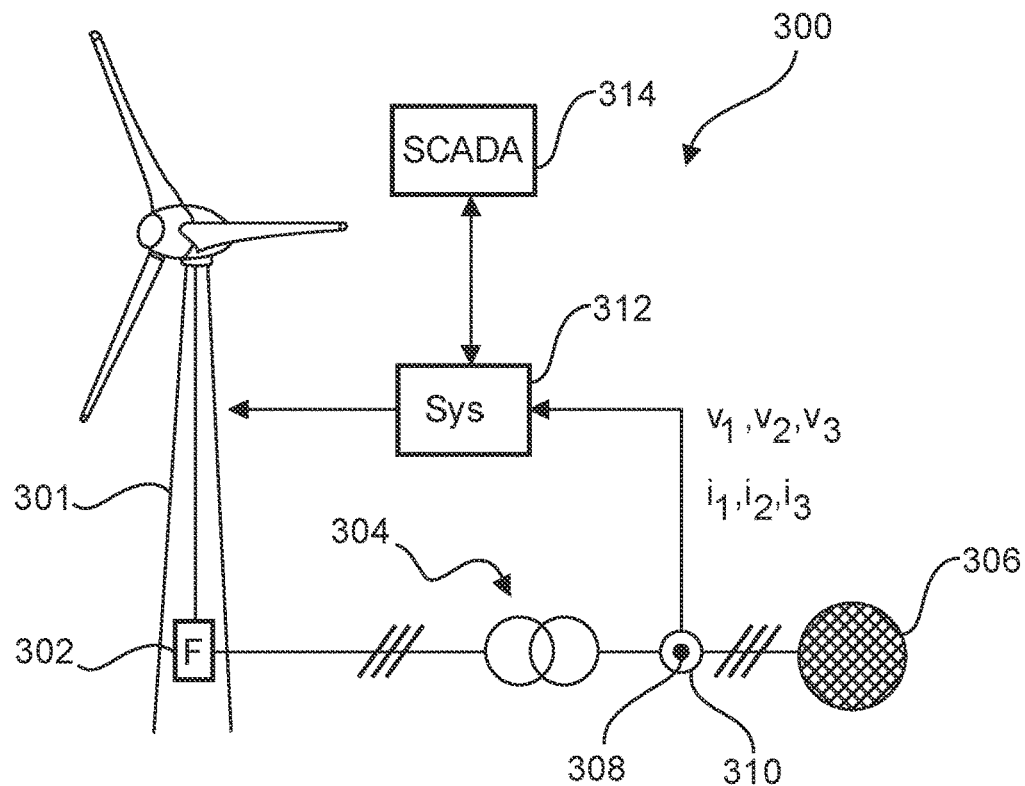
FIG. 3 shows a schematic illustration of a simplified structure for the capturing and further processing of low-frequency oscillations.

FIG. 3 schematically shows a simplified structure as an overview of a proposed analysis of low-frequency oscillations for detecting such low-frequency oscillations. According to this overview structure 300, a wind power installation 301 is schematically illustrated and supplies an electrical supply grid 306 in a three-phase manner via a transformer 304, for example by means of a schematically illustrated frequency inverter 302. The currents $i_1$, $i_2$, $i_3$ supplied in this case and the voltages $v_1$, $v_2$ and $v_3$ of each phase which are present in this case are captured here at the measurement point 308 by means of a schematically indicated measurement device (voltmeter, ammeter or multimeter) 310 and are supplied to the evaluation system (controller) 312. The measurement point 308 may also form a grid connection point of the electrical supply grid 306. The voltages $v_1$, $v_2$ and $v_3$ captured at the measurement point 308 therefore simultaneously also form the voltages of the electrical supply grid 306 at this grid connection point at the measurement point 308. In any case, however, these voltages captured at the measurement point 308 can provide information relating to the corresponding voltages in the electrical supply grid 306.

The signals captured in this manner, specifically voltages and currents, can then be evaluated in the evaluation system 312. In this case, the evaluation can also use an external system which is illustrated here in the external block 314 as SCADA. This SCADA or SCADA system in the external block 314 can at least carry out or support the analysis for detecting low-frequency oscillations. It also comes into consideration that this SCADA system according to the external block 314 is additionally used to carry out additional analyses, for example, in order to improve the actual analysis for detecting the low-frequency oscillations, for example. The evaluation result could be remotely transmitted by means of a communication connection to the SCADA system according to block 314.

Figure 4:
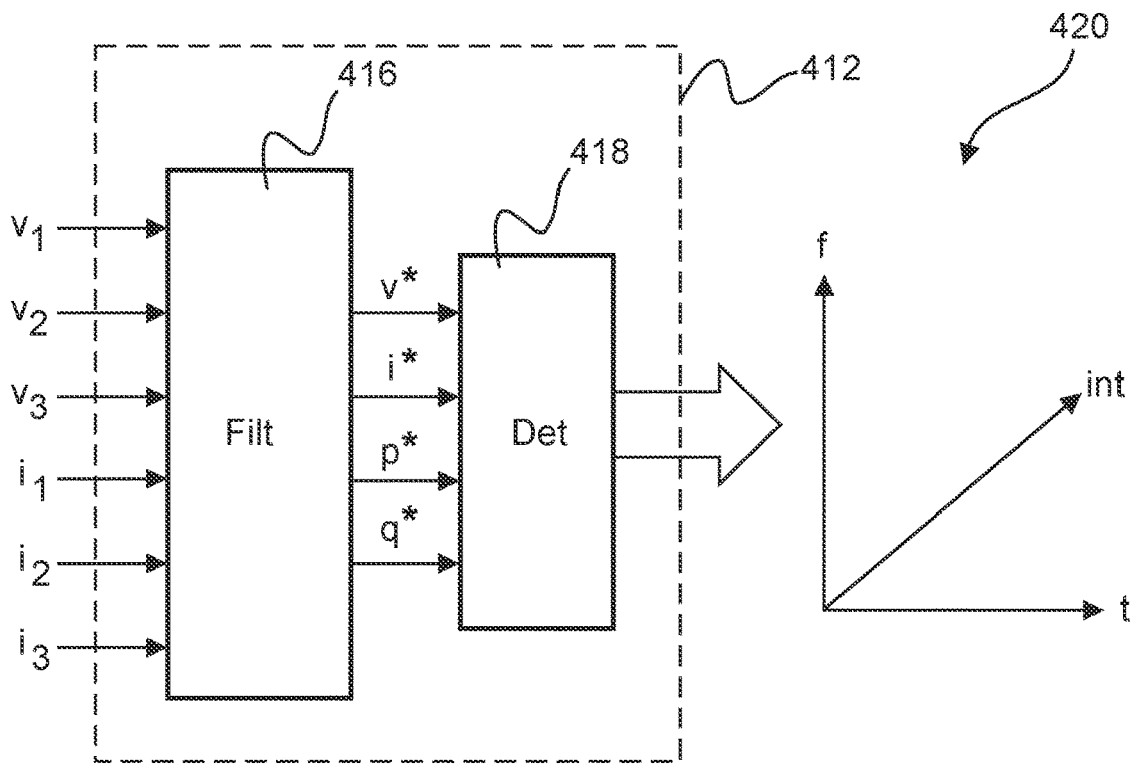
FIG. 4 illustrates a section of the structure from FIG. 3.

According to one embodiment, the analysis for detecting the low-frequency oscillations is carried out in the evaluation system 312 and this is illustrated in FIG. 4.

FIG. 4 therefore likewise schematically shows the evaluation system 312 but with further details. The possible communication to the external block 314 is not illustrated in FIG. 4 for the sake of simplicity.

For the sake of simplicity, the evaluation system 312 is indicated as an evaluation system 412 in FIG. 4. It is shown there that the six measurement variables $v_1$, $v_2$, $v_3$ and $i_1$, $i_2$, $i_3$ form input variables in the filter block (filter, bandpass filter or low-pass filter) 416. Therefore, filtering which filters out, for example, high-frequency components from the captured signals can be carried out in the filter block 416. However, the filter block 416 also extracts components from these measurement signals in the process or subsequently for filtering. In particular, provision is made for a representative voltage $v^*$, a representative current $i^*$, a total active power $p^*$ and a total reactive power $q^*$ to be determined. In this case, these representative variables or total variables each together represent a corresponding signal for all three phases. These four variables which form the output of the filter block 416 are accordingly each input as a time signal in the determination block (controller) 418. The determination, that is to say the ascertainment, of the low-frequency oscillations is then carried out in the determination block 418 and at least a first important step thereof is carried out. The respective electrical signal, that is to say $v^*$, $i^*$, $p^*$ or $q^*$, is specifically evaluated by means of wavelet analysis in the determination block 418. This is carried out in such a manner that a time-dependent frequency pattern is created by analyzing a correlation of the respective captured signal with a predetermined wavelet mother function. Said signals which are output by the filter block 416 and are input to the determination block 418, that is to say the voltage $v^*$, the current $i^*$, the power $p^*$ and the reactive power $q^*$, therefore each form a captured signal.

Such wavelet analysis can then be carried out with each of the four signals which are transferred from the filter block 416 to the determination block 418. The resulting four results can then be processed further and, in the simplest case, only the most meaningful result is used further.

In any case, the result of the analysis in the determination block 418 is a time-dependent frequency pattern 420 which is only schematically indicated in FIG. 4. Only a three-dimensional coordinate cross is specifically used there to indicate that the result shows a time-dependent frequency, in which case the intensity can be additionally considered. This is intended to be indicated by the three axis labels "t", "f" and "int". A further illustration of this result, which indicates this time-dependent frequency pattern 420 here, is also explained in connection with FIG. 6.

Figure 5:
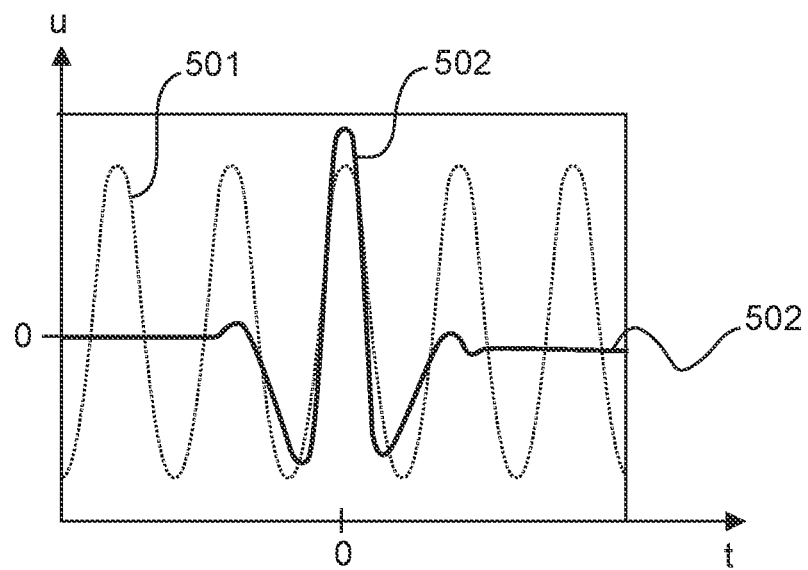
FIG. 5 illustrates possible signal evaluation of an element from FIG. 4.

FIG. 5 schematically shows a possible evaluation which can be carried out in the determination block 418 in FIG. 4. In this example in FIG. 5, wavelet analysis is carried out by means of a correlation analysis, during which the captured signal 501 is correlated with a wavelet mother function 502. In this case, the wavelet mother function 502 is symmetrical over time and its maximum value in this case forms its temporal center and this is placed at the temporal zero point during the analysis. At this temporal zero point, on account of the high amplitude of the wavelet mother function, a high degree of correlation also results in a high intensity at that time. At times considerably before or considerably after this temporal zero point which is taken as a basis, the wavelet mother function 502 is substantially zero, with the result that a correlation can no longer occur there and accordingly no intensity either.

Such an analysis illustrated in FIG. 5 is constantly repeated continuously or at least virtually continuously, thus resulting in a time-dependent frequency pattern with intensities.

The captured signal 501 can therefore be the sinusoidal voltage signal which is representative of the three phase voltages $v_1$, $v_2$ and $v_3$. This sinusoidal signal is fundamentally naturally known and the wavelet mother function 502 can be accordingly adapted thereto. The low-frequency oscillations to be captured are, in this respect, superimpositions on the ideally sinusoidal function, and these superimpositions are intended to be extracted by means of this wavelet analysis, that is to say also by the choice of the wavelet mother function 502, or to emerge at least to a greater extent.

Figure 6:
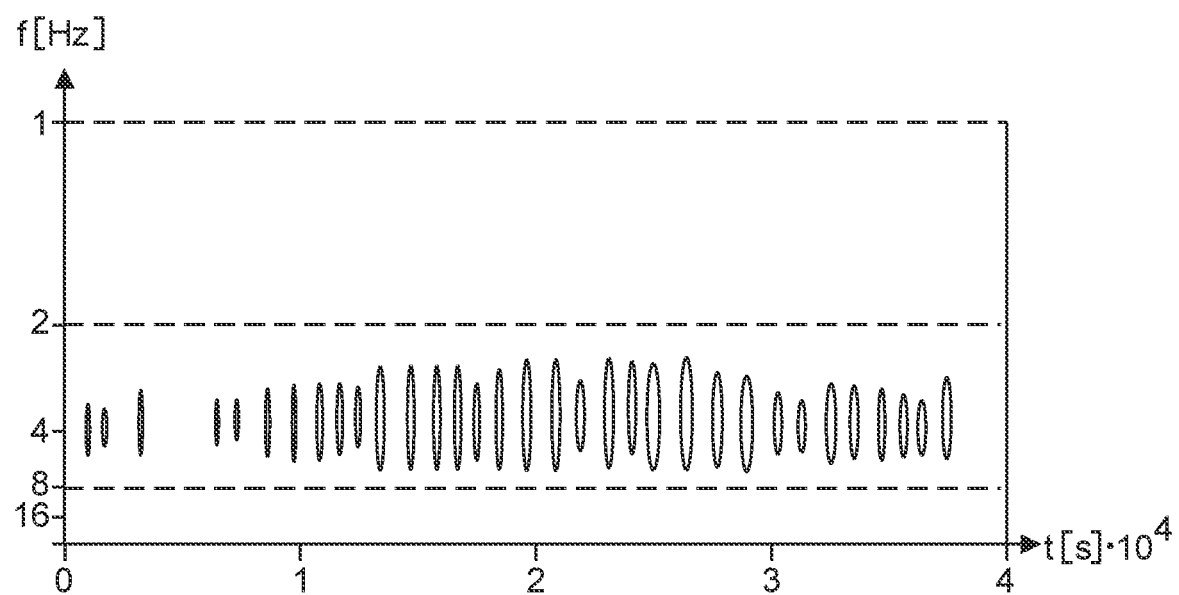
FIG. 6 illustrates a possible result of the analysis illustrated in FIG. 4.

FIG. 6 illustrates a time-dependent frequency pattern which therefore corresponds to the result from the determination block 418, that is to say the time-dependent frequency pattern indicated in FIG. 4, and this is also the result of a continuously repeated analysis explained in connection with FIG. 5.

In FIG. 6, the graph shows a frequency range, which is plotted logarithmically, over a time range from 0 to 40 000 s. The frequency is plotted here approximately from 30 Hz to 1 Hz. In order to improve the illustration, frequency lines for 1 Hz, 2 Hz and 8 Hz are depicted using dashed lines.

The result of the wavelet analysis is to show intensities which have respectively occurred at the respective times and the respective frequencies. In this case, the representation usually uses a color scale in which, for example, the color scale extends from dark blue, via green and orange, to yellow, in which case dark blue can represent a low intensity and yellow can represent a high intensity. In FIG. 6, an attempt was made to illustrate such an intensity by means of accordingly pronounced regions in order to manage without a color scale. Therefore, there is a high intensity approximately in the range from 3 to 6 Hz. However, it can also be seen that this intensity is particularly pronounced in the range between 2 and 3, that is to say between 20 000 and 30 000 s. It can therefore be seen that a particularly strong oscillation has occurred in the range from 3 to 6 Hz in the three hours taken as a basis there. No significant intensity occurs in this frequency range in the range from 0 to 1, that is to say 0 to 10 000 s. Accordingly, a conclusion with regard to this low-frequency oscillation or low-frequency oscillations can be derived therefrom.

In order to carry out control which counteracts a low-frequency oscillation, the practice of considering a considerably shorter period also comes into consideration, however. For this purpose, the described analysis can be carried out for an accordingly shorter period. The wavelet mother function can be adapted for this but can possibly also be used further without change. In any case, in so far as the wavelet mother function is tuned to the expected frequency range in which the low-frequency oscillations are expected, adaptation to a shorter capture period is not absolutely necessary.

Provided is a unit (device) which can observe and assess energy system stability. In this case, it was recognized that oscillations in the energy system, in particular in the electrical supply grid, which are also referred to as power system oscillations (PSO) or energy system oscillations, may be a good indicator of the instability of energy systems. Furthermore, the observation and identification of power system oscillations may become an important part of future grid services which are aimed at attenuating such oscillations, for example.

The present disclosure is therefore aimed at identifying power system oscillations. The observation of power system oscillations may be helpful not only for a warning system for operating wind farms, but rather this information can also be used to generate and supply suitable attenuation signals for attenuating the power system oscillations by means of a wind farm.

Unlike in other known approaches for identifying low-frequency oscillations, a wavelet-based method is used here. In this respect, it was recognized that the use of wavelets makes it possible to detect non-stationary phenomena with locality properties both in the time domain and in the frequency domain.

The proposed solution is fundamentally suitable for units connected to integrated grids, such as wind power installations or wind farms, but is not restricted thereto. The proposed solution can also be applied to consumer units (devices).

The proposed method therefore relates to online detection of power system oscillations. It is suitable for production and for consumer installations.

The method is based on an online analysis of transient measurement data, for example from a grid connection point.

Provided herein is detecting power system oscillations on the basis of a transient measurement of the measured grid connection voltage and powers. A sampling rate of preferably at least 500 Hz for low-frequency oscillations in the frequency range of 0<f<five times the nominal frequency is proposed for all available measurement channels.

The proposed wavelet-based method can be used to detect both periodic and aperiodic frequencies in the stated frequency range, which may depend on the duration of the time window to be analyzed because the proposed wavelets should have the locality property both in the frequency domain and in the time domain as far as possible.

The selection of the wavelet mother function, which can also be referred to as a mother wavelet, and of the time window to be analyzed may play a role.

Such a system or method for detecting power system oscillations can be implemented both at the level of wind power installations and at the level of wind farms, which is hereby proposed.

The proposed method is also suitable for being automated. A proposed criterion is that the integral of the mother wavelets, preferably of all mother wavelets, should be zero. This is proposed, in particular, and is not generally obvious for a wavelet method since mother wavelets can also be different in other applications.

The invention claimed is:
1. A method for detecting low-frequency oscillations in an electrical supply grid having a grid voltage associated with a nominal frequency, comprising:
capturing at least one electrical signal from the electrical supply grid, the capturing including detecting a three-phase voltage of the grid voltage;
transforming the three-phase voltage into a d/q representation;
evaluating the transformed three-phase voltage using wavelet analysis, including:
generating a time-dependent frequency pattern based on analyzing a correlation between the transformed three-phase voltage and a wavelet mother function;
detecting a presence of a low-frequency component and a fundamental component in the time-dependent frequency pattern; and
in response to detecting the presence of the low-frequency component and the fundamental component in the time-dependent frequency pattern, determining that a low-frequency oscillation is present,
wherein the method is performed at a grid connection point where a wind power installation or wind farm supplies electrical current to the electrical supply grid, and
wherein the at least one electrical signal is a voltage at the grid connection point or a voltage proportional to the voltage at the grid connection point.
2. The method as claimed in claim 1, comprising:
determining whether the low-frequency component fluctuates; or
determining whether the low-frequency component fluctuates periodically.
3. The method as claimed in claim 1, comprising:
capturing a temporal profile of an amplitude of the low-frequency component.
4. The method as claimed in claim 1, comprising:
evaluating the at least one electrical signal based on a test frequency range, wherein:
the test frequency range is from a frequency lower limit to a frequency upper limit,
the frequency lower limit is between 0.1 Hz and 2 Hz, and
the frequency upper limit is between the nominal frequency and five times the nominal frequency or the frequency upper limit is the nominal frequency.
5. The method as claimed in claim 1, wherein the wavelet mother function has at least one property from a list of properties including:
the wavelet mother function is scalable in time or frequency;
the wavelet mother function is shiftable in time;
the wavelet mother function has locality both in a frequency domain and in a time domain;
the wavelet mother function has an integral of 0 in the time domain; and
the wavelet mother function is a Morlet wavelet, a Daubechies D20 wavelet or a Mexican hat.
6. The method as claimed in claim 1, comprising:
selecting the wavelet mother function based on a selection criterion; and
selecting the wavelet mother function from a plurality of predetermined wavelet functions.
7. The method as claimed in claim 1, wherein:
the low-frequency oscillation is a grid oscillation,
the wind power installation includes a rotor with rotor blades, a generator, and an inverter that supplies electrical power to the electrical supply grid, and the method comprises:
  determining whether the wind power installation causes the grid oscillation by at least:
    identifying a low-frequency oscillation of the wind power installation as an installation oscillation using wavelet analysis of a DC link voltage of a DC link of the inverter;
    determining whether the grid oscillation and the installation oscillation are correlated; and
    determining the wind power installation causes the grid oscillation in response to determining that the grid oscillation and the installation oscillation are correlated.

8. The method as claimed in claim 7, comprising:
  in response to determining that the wind power installation causes the grid oscillation,
    determining whether the installation oscillation exceeds a predefined oscillation amplitude, and
    in response to determining that the installation oscillation exceeds the predefined oscillation amplitude, initiating an attenuation measure including at least one measure from a list of measures including:
      increasing an attenuation component of a controller of the generator;
      increasing a stator current of the generator;
      adjusting, using pitch control, a blade angle of the rotor blades to adjust the attenuation component;
      increasing an attenuation component of a supply controller to control the inverter to supply the electrical supply grid;
      shifting an operating point of power supply;
      reducing the power supply; and
      activating current control of the inverter to control a supply current and adjust the attenuation component.

9. The method as claimed in claim 1, wherein:
  capturing the at least one electrical signal includes sampling, at a sampling frequency, a measurement to respectively obtain a sampling signal of the at least one electrical signal, wherein
    the sampling frequency is higher than a frequency of the fundamental component, the sampling frequency is a multiple of the frequency of the fundamental component or the sampling frequency is at least ten times the frequency of the fundamental component, and
  evaluating the at least one electrical signal includes evaluating the sampling signal of respective samples using the wavelet analysis.

10. The method as claimed in claim 1, wherein the low-frequency oscillations are a subsynchronous resonance.

11. The method as claimed in claim 1, wherein the wavelet mother function is parameterized.

12. The method as claimed in claim 6, wherein the low-frequency component and the low-frequency oscillation have a frequency between 1 Hz and five times the nominal frequency.

13. The method as claimed in claim 6, wherein the selection criterion has at least one expected value of the at least one electrical signal.

14. The method as claimed in claim 9, wherein evaluating the sampling signal of the respective samples using the wavelet analysis is performed without filtering the respective samples.

15. A detection device for detecting low-frequency oscillations in an electrical supply grid having a grid voltage and an associated a grid nominal frequency, comprising:
  a sensor configured to capture at least one electrical signal from the electrical supply grid, the at least one electrical signal comprising a three-phase voltage of the grid voltage; and
  a controller configured to:
    transform the three-phase voltage into a d/q representation;
    evaluate the transformed three-phase voltage using wavelet analysis, including:
      generating a time-dependent frequency pattern based on analyzing a correlation between the transformed three-phase voltage and a predetermined wavelet mother function;
      detecting a presence of at least one low-frequency component and a fundamental component in the time-dependent frequency pattern; and
      in response to detecting the presence of the low-frequency component and the fundamental component in the time-dependent frequency pattern, determining that a low-frequency oscillation is present,
  wherein the detection device is positioned at a grid connection point where a wind power installation or wind farm supplies electrical current to the electrical supply grid, and
  wherein the at least one electrical signal is a voltage at the grid connection point or a voltage proportional to the voltage at the grid connection point.

16. A wind power installation or wind farm configured to supply electrical power to an electrical supply grid and to be connected to the electrical supply grid at a grid connection point, the wind power installation or wind farm comprising:
  a controller configured to:
    detect low-frequency oscillations in the electrical supply grid, wherein the electrical supply grid has a grid voltage and is associated with a grid nominal frequency, and the low-frequency oscillations to be detected have a lower frequency than the grid nominal frequency; and
  a sensor configured to capture at least one electrical signal from the electrical supply grid, the at least one electrical signal comprising a three-phase voltage of the grid voltage;
  wherein the controller is configured to:
    transform the three-phase voltage into a d/q representation;
    evaluate the transformed three-phase voltage using wavelet analysis, including:
      generating a time-dependent frequency pattern based on analyzing a correlation between the transformed three-phase voltage and a predetermined wavelet mother function;
      detecting a presence of a low-frequency component and a fundamental component in the time-dependent frequency pattern; and
      in response to detecting the presence of the low-frequency component and the fundamental component in the time-dependent frequency pattern, determining that a low-frequency oscillation is present,
  wherein the sensor is positioned at the grid connection point where the wind power installation or wind farm supplies electrical current to the electrical supply grid, and wherein the at least one electrical signal is a voltage at the grid connection point or a voltage proportional to the voltage at the grid connection point.

\* \* \* \* \*